(12) United States Patent
Hong et al.

(10) Patent No.: US 11,287,913 B2
(45) Date of Patent: Mar. 29, 2022

(54) COLOR FILTER-INTEGRATED TOUCH SENSOR AND MANUFACTURING METHOD THEREFOR

(71) Applicant: DONGWOO FINE-CHEM CO., LTD., Iksan-si (KR)

(72) Inventors: Young Kyun Hong, Pyeongtaek-si (KR); Duckkyeom Kim, Seoul (KR); Myeongwon Lee, Incheon (KR); Geun Wang Ji, Pyeongtaek-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 16/968,671

(22) PCT Filed: Feb. 12, 2019

(86) PCT No.: PCT/KR2019/001681
§ 371 (c)(1),
(2) Date: Aug. 10, 2020

(87) PCT Pub. No.: WO2019/160297
PCT Pub. Date: Aug. 22, 2019

(65) Prior Publication Data
US 2021/0004104 A1    Jan. 7, 2021

(30) Foreign Application Priority Data
Feb. 19, 2018  (KR) .................. 10-2018-0019271

(51) Int. Cl.
*G06F 3/041*   (2006.01)
*G02B 5/20*    (2006.01)
(Continued)

(52) U.S. Cl.
CPC .......... *G06F 3/0412* (2013.01); *G02B 5/201* (2013.01); *G02F 1/13338* (2013.01);
(Continued)

(58) Field of Classification Search
CPC ....... G02B 1/14; G02B 5/201; G02F 1/13338; G02F 1/133514; G06F 2203/04103;
(Continued)

(56) References Cited

U.S. PATENT DOCUMENTS

| | | | |
|---|---|---|---|
| 2020/0033976 A1* | 1/2020 | Yin | G06F 3/0412 |
| 2020/0110494 A1* | 4/2020 | Chen | H01L 25/0753 |
| 2020/0251528 A1* | 8/2020 | Lee | H01L 27/323 |

FOREIGN PATENT DOCUMENTS

| | | |
|---|---|---|
| JP | 2011-170252 A | 9/2011 |
| JP | 2014-063484 A | 4/2014 |

(Continued)

OTHER PUBLICATIONS

International search report for PCT/KR2019/001681 dated May 27, 2019.

*Primary Examiner* — Chad M Dicke
(74) *Attorney, Agent, or Firm* — Sughrue Mion, PLLC (57) ABSTRACT

A color filter-integrated touch sensor is disclosed. The color-filter-integrated touch sensor includes a color filter disposed on a first surface side of a substrate and a touch sensor disposed on a second surface side of the substrate. A manufacturing method thereof is disclosed.

18 Claims, 4 Drawing Sheets

(51) Int. Cl.
  *G02F 1/1333* (2006.01)
  *H01L 27/32* (2006.01)
(52) U.S. Cl.
  CPC .......... *H01L 27/322* (2013.01); *H01L 27/323* (2013.01); *G06F 2203/04103* (2013.01)
(58) Field of Classification Search
  CPC ........ G06F 3/041; G06F 3/0412; G06F 3/044; H01L 27/322; H01L 27/323; H01L 51/52; H01L 51/56
  USPC .................................................. 345/170–178
  See application file for complete search history.

(56) References Cited

FOREIGN PATENT DOCUMENTS

| KR | 10-2011-0127101 A | 11/2011 |
| KR | 10-2013-0027390 A | 3/2013 |
| KR | 10-2017-0023717 A | 3/2017 |
| KR | 10-2017-0112483 A | 10/2017 |
| KR | 10-2017-0123482 A | 11/2017 |
| KR | 10-2017-0135174 A | 12/2017 |
| KR | 10-1816134 B1 | 1/2018 |

* cited by examiner

COLOR FILTER-INTEGRATED TOUCH SENSOR AND MANUFACTURING METHOD THEREFOR

CROSS-REFERENCE TO RELATED APPLICATIONS

This application is a National Stage of International Application No. PCT/KR2019/001681 filed on Feb. 12, 2019, which claims priority under U.S.C. § 119(a) to Korean Patent Application No. 10-2018-0019271 filed Feb. 19, 2018.

TECHNICAL FIELD

The present invention relates to a color filter-integrated touch sensor and a method of manufacturing the same.

BACKGROUND ART

As a touch input method has been spotlighted as a next-generation input method, it has been introduced into various electronic devices.

In particular, an ultra-thin film display that achieves ultra-light weight, low power consumption, and improved portability is attracting attention as a next-generation display, and there is a need to develop a touch sensor applicable to such display.

In order to apply the touch input method to a thin film display, a capacitive touch sensor panel overlaid on an LCD or an OLED can be used, and the capacitive touch sensor panel may be formed of a matrix of touch driving lines and touch sensing lines, which are made of a substantially transparent conductive material such as indium tin oxide (ITO). These touch driving lines and touch sensing lines are often arranged in rows and columns on a substantially transparent substrate. When an object, such as a user's finger, is near the intersection of the touch driving line and the touch sensing line, the capacitance between the touch driving line and the touch sensing line may change. This change in capacitance may indicate that a touch is taking place at this location.

However, when the capacitive touch sensor panel is overlaid on an LCD or an OLED, there are problems such as an increase in the thickness and weight of the display, a decrease in brightness, and an increase in manufacturing cost.

Accordingly, attempts have been made to integrate and configure the touch sensor into the display device.

For example, Korean Patent Laid-Open Publication No. 10-2017-0135174 discloses a color filter array having a touch sensor comprising: a plurality of color filters arranged in the first and second directions on a substrate; a touch block electrode disposed on the color filter to sense a user's touch location; a black matrix disposed on the touch block electrode between the color filters; and a touch sensing line disposed in one of the first and second directions and connected to the touch block electrode.

However, in this method, since the color filter, the touch block electrode, the black matrix, and the touch sensing line are sequentially stacked on the substrate, there is a high possibility of defects due to a decrease in flatness in the process.

In addition, as the black matrix is formed on the touch block electrode and the touch sensing line is stacked thereon, residues due to the organic layer may appear, which adversely affects the input sensing performance of the touch sensor.

PRIOR ART DOCUMENT

Korean Patent Laid-Open Publication No. 10-2017-0135174

DISCLOSURE OF INVENTION

Technical Problem

The present invention has been devised from the technical background as described above, an object of which is to implement two functional devices on one substrate by integrating a color filter and a touch sensor.

Another object of the present invention is to provide a color filter-integrated touch sensor having excellent touch input sensing performance.

Yet another object of the present invention is to provide a method of manufacturing a color filter-integrated touch sensor having excellent touch input sensing performance and reducing defects caused by flatness degradation.

Technical Solution

In order to solve these problems, the present invention provides a color filter-integrated touch sensor comprising: a substrate having a first surface and a second surface; a color filter disposed on the first surface side of the substrate; and a touch sensor disposed on the second surface side of the substrate, wherein a peeling strength of the color filter and the touch sensor from the substrate is 2N/25 mm to 15N/25 mm, and a width of at least some of wires constituting the touch sensor is 4 to 6 μm.

In the touch sensor, a distance between at least some of the wires constituting the touch sensor may be 4 to 6 μm.

The touch sensor may include: a first transparent electrode layer on the second surface of the substrate; a metal electrode layer on the first transparent electrode layer; an insulation layer on the metal electrode layer; a second transparent electrode layer on the insulation layer; and a passivation layer on the second transparent electrode layer, and a width of the first transparent electrode layer and a width of the metal electrode layer may be identical in at least some of the wires constituting the touch sensor.

The substrate may be a glass substrate with a thickness of 0.1 mm to 1.0 mm.

According to another aspect of the present invention, there is provided a method of manufacturing a color filter-integrated touch sensor comprising steps of: forming a color filter including a black matrix and a pixel region on a first surface of a substrate; adhering a protective film on the color filter; flipping the substrate; forming a touch sensor on a second surface of the substrate; and removing the protective film.

A peeling strength of the color filter and the touch sensor from the substrate may be 2N/25 mm to 15N/25 mm.

A peeling strength of the protective film may be 0.01N/25 mm to 1.5N/25 mm.

The step of forming a touch sensor may include steps of: forming a first transparent electrode layer on the second surface; forming a metal electrode layer on the first transparent electrode layer; forming an insulation layer on the metal electrode layer; forming a second transparent electrode layer on the insulation layer; and forming a passivation layer on the second transparent electrode layer.

The step of forming a first transparent electrode layer may be a step of forming the first transparent electrode layer using an alignment key formed together with the black matrix in the step of forming a color filter.

The metal electrode layer may have a same width as that of the first transparent electrode layer in at least some of wires constituting the touch sensor.

A width of at least some wires of the first transparent electrode layer may be 4 to 6 μm.

A distance between at least some wires of the first transparent electrode layer may be 4 to 6 μm.

The method may further comprise a step of etching the substrates after the step of adhering a protective film.

According to yet another aspect of the present invention, there is provided a thin film display including the above color filter-integrated touch sensor.

The thin film display may be a liquid crystal display or an organic light emitting diode display.

Advantageous Effects

According to the color filter-integrated touch sensor in accordance with the present invention, it is possible to implement two functional devices on one substrate by forming a color filter and a touch sensor on each side of the substrate, respectively.

In the color filter-integrated touch sensor of the present invention, alignment precision is improved by forming the color filter and the touch sensor on each side of the substrate.

In the color filter-integrated touch sensor of the present invention, flatness is improved to reduce defects by forming the color filter and the touch sensor on each side of the substrate, thereby obtaining excellent touch input sensing performance.

In the color filter-integrated touch sensor of the present invention, the wiring resolution of the touch sensor can be increased, and accordingly, a display device having a narrow bezel area can be realized.

BEST MODE

Hereinafter, preferred embodiments of a color filter-integrated touch sensor and a method of manufacturing the same according to the present invention will be described in detail with reference to the drawings. However, the drawings attached to the present specification are only examples for explaining the present invention, and the present invention is not limited by the drawings. In addition, for convenience of description, some components may be exaggerated or reduced or omitted in the drawings.

Figure 1:
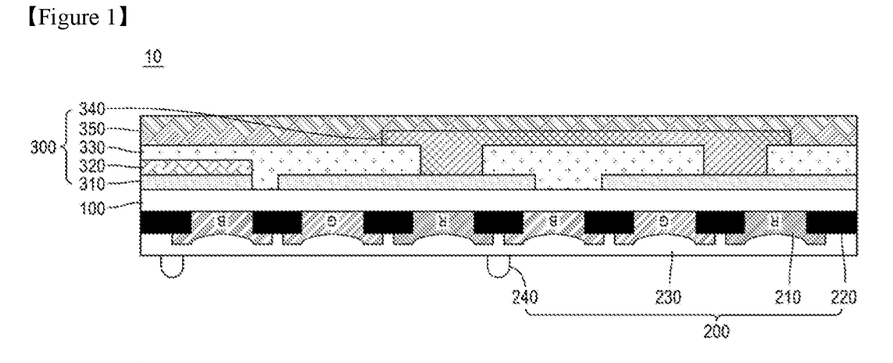
FIG. 1 is a cross-sectional view of a color filter-integrated touch sensor according to an embodiment of the present invention.

FIG. 1 is a cross-sectional view of a color filter-integrated touch sensor according to an embodiment of the present invention.

Referring to FIG. 1, the color filter-integrated touch sensor 10 according to an embodiment of the present invention comprises a substrate 100, a color filter 200 formed on a first surface of the substrate 100 (a lower surface of the substrate 100 in FIG. 1), and a touch sensor 300 formed on a second surface of the substrate 100 (an upper surface of the substrate 100 in FIG. 1) opposite to the first surface.

In an embodiment of the present invention, the substrate 100 may be a glass substrate, and a thickness of the substrate 100 may be 0.1 mm to 1.0 mm.

The color filter 200 includes a pixel region 210 and a black matrix 220.

The black matrix 220 is a light blocking layer that blocks light except for the pixel region 210 and prevents color mixing at the boundary of each colorant layer. Therefore, the black matrix 220 is formed of an opaque material and patterned to surround the pixel region 210.

The pixel region 210 is a colorant layer for realizing colors for a color display. It generally includes red, green, and blue regions, and the regions are defined by the black matrix 220 pattern.

However, the pixel region 210 needs not include all of red, green, and blue regions, and it is not necessary to include only red, green, and blue regions. Rather, only some of the colors may be included or other colors such as white may also be included depending on the color expression method of the thin film display.

An overcoat layer 230 is formed on the pixel region 210 and the black matrix 220, and a photo spacer 240 is formed on the overcoat layer 230.

The color filter 200 may be formed of a material having a peeling strength from the substrate 100 of 2N/25 mm or more.

The touch sensor 300 includes a first transparent electrode layer 310, a metal electrode layer 320 on the first transparent electrode layer 310, an insulation layer 330 covering the first transparent electrode layer 310 and the metal electrode layer 320, a second transparent electrode layer 340 on the insulation layer 330, and a passivation layer 350 covering the second transparent electrode layer 340.

The first and the second transparent electrode layers 310 and 340 may be made of a transparent conductive material, which may be selected from metal oxides composed of indium tin oxide (ITO), indium zinc oxide (IZO), indium zinc tin oxide (IZTO), aluminum zinc oxide (AZO), gallium zinc oxide (GZO), and fluorine tin oxide (FTO).

The metal electrode layer 320 may be made of a metal such as gold (Au), silver (Ag), copper (Cu), molybdenum (Mo), and silver-palladium-copper alloy (APC).

In an embodiment of the present invention, the touch sensor 300 may be formed of a material having a peeling strength from the substrate 100 of 2N/25 mm or more.

In an embodiment of the present invention, a wiring width of the first transparent electrode layer 310 and the metal electrode layer 320 may be 4 to 10 μm, and a wiring distance of the first transparent electrode layer 310 and the metal electrode layer 320 may also be 4 to 10 μm. More preferably, the wiring width and the wiring distance may be 4 to 6 μm, respectively.

Now, a method of manufacturing a color filter-integrated touch sensor according to an embodiment of the present invention will be described in detail. FIGS. 2A to 2G are cross-sectional views of each step according to a method of manufacturing a color filter-integrated touch sensor according to an embodiment of the present invention.

Figure 2A:
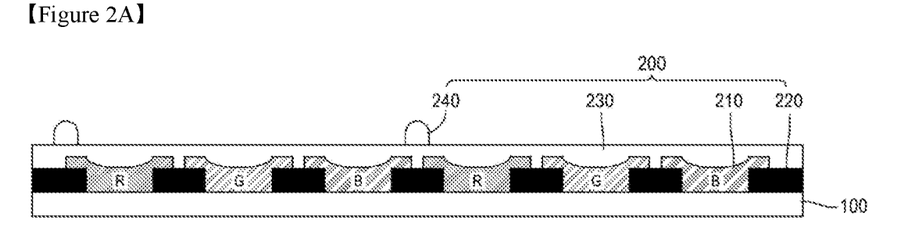
FIGS. 2A to 2G are cross-sectional views of each process step according to a method of manufacturing a color filter-integrated touch sensor according to an embodiment of the present invention.

Referring to FIG. 2A, a substrate 100 for manufacturing a color filter-integrated touch sensor is prepared.

The substrate 100 may be a glass substrate, and it may be an etched or unetched substrate. The unetched substrate may have a thickness of 0.2 mm to 2.0 mm, and the etched substrate may have a thickness of 0.1 mm to 1.0 mm.

Next, as shown in FIG. 2A, a color filter 200 including a black matrix 220 and a pixel region 210 is formed on one surface of the substrate 100.

In the process of forming the color filter 200, a black matrix pattern may be formed first and a colorant layer in the pixel region may be formed thereafter. Or, conversely, the colorant layer in the pixel region may be formed first, and then the black matrix pattern may be formed next.

As described with reference to FIG. 1, the color filter 200 may be formed of a material having a peeling strength from the substrate 100 of 2N/25 mm or more and 15N/25 mm or less, and preferably 10N/25 mm or less.

Meanwhile, in the step of forming the black matrix 220, an alignment key (not shown) for forming a transparent electrode layer of the touch sensor may be formed together.

Figure 2B:
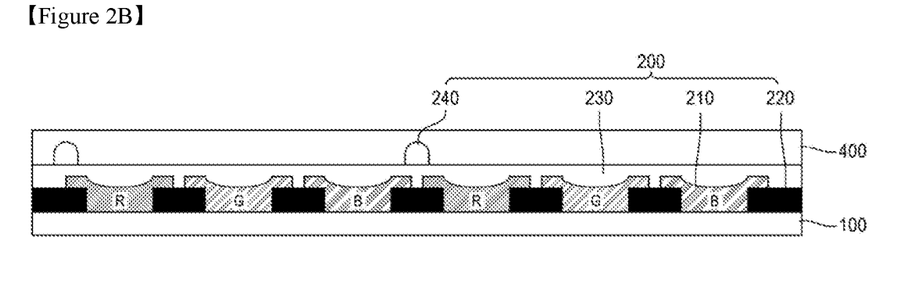

Next, as shown in FIG. 2B, a protective film 400 is attached on the color filter 200.

The protective film 400 is attached to protect the color filter 200 in the manufacturing process of the touch sensor in the future. The peeling strength of the protective film may be 0.01N/25 mm to 1.5N/25 mm after 150 degrees/1 hour or more in consideration of the subsequent process temperature and time.

In addition, the protective film may have a weight loss of 1% or less at the above temperature and holding time. During the above temperature and holding time, the protective film should be free of adhesive residues after adhesion and free of external appearance changes, air bubbles, etc. After peeling, there should be no damage such as tearing or residue on the color filter surface and the opposing touch sensor surface.

The protective film may be an organic material structure or an organic-inorganic composite structure, and may be made of, for example, polyimide (PI), polyethylene phthalate (PET), or the like. To increase the hardness of the protective film, a hard coating may be added to the surface. For example, a siloxane-based, epoxy-based or urethane-based hard coating may be used.

Figure 2C:
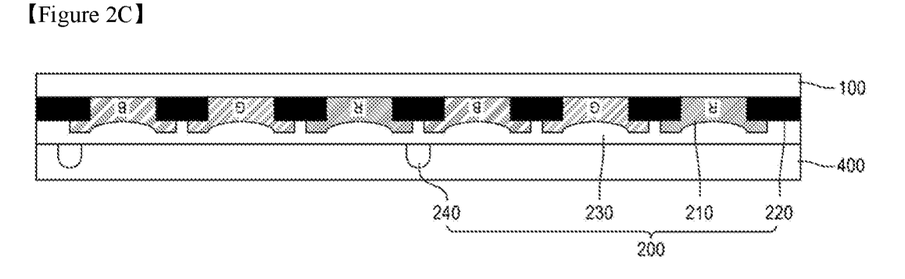

Now, as shown in FIG. 2C, the substrate 100 on which the protective film 400 covering the color filter 200 is attached is turned over and is prepared for forming a touch sensor on the opposite side, that is, the back side of the substrate 100.

At this time, when using an unetched glass substrate as the substrate 100, the substrate 100 may be etched before forming the touch sensor.

Figure 2D:
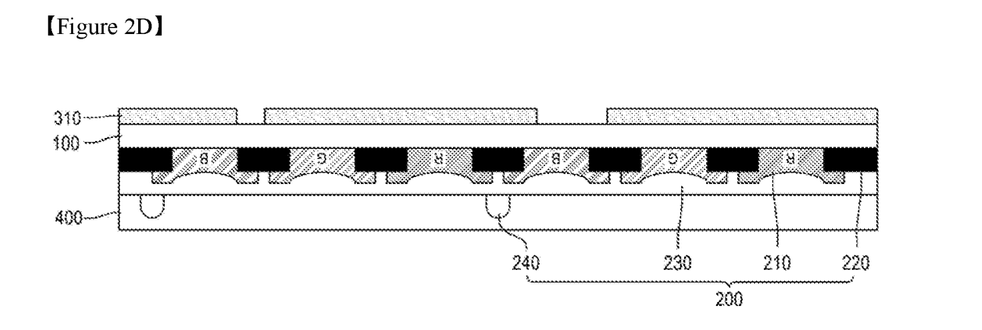

Next, referring to FIG. 2D, a first transparent electrode layer 310 constituting a touch sensor is formed on the back surface of the substrate 100. The first transparent electrode layer 310 may be formed by aligning the alignment key formed together in the black matrix forming step with the first transparent electrode layer 310 on the opposite surface of the substrate 100.

Figure 2E:
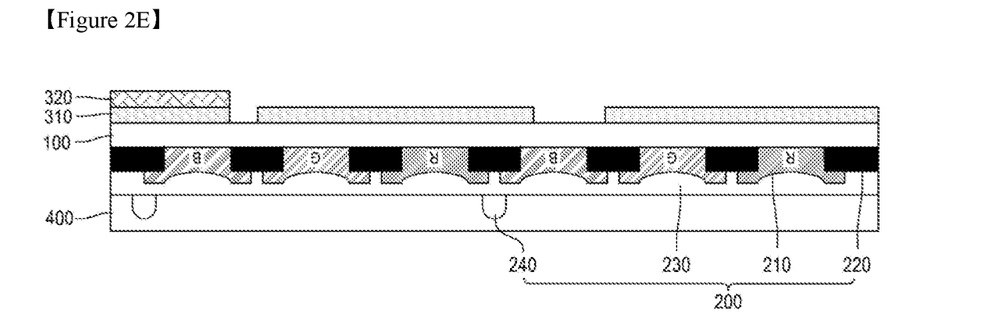

Subsequently, as shown in FIG. 2E, a metal electrode layer 320 is formed on the first transparent electrode layer 310, which may be formed by aligning the metal electrode layer 320 using an alignment key of the first transparent electrode layer 310.

That is, according to the manufacturing method of the color filter-integrated touch sensor in accordance with an embodiment of the present invention, the first transparent electrode layer 310 is first patterned in the touch sensor manufacturing process, and then the metal electrode layer 320 on the first transparent electrode layer 310 is patterned, thereby enabling a fine pattern formation of the touch sensor. Details of this will be described later.

Figure 2F:
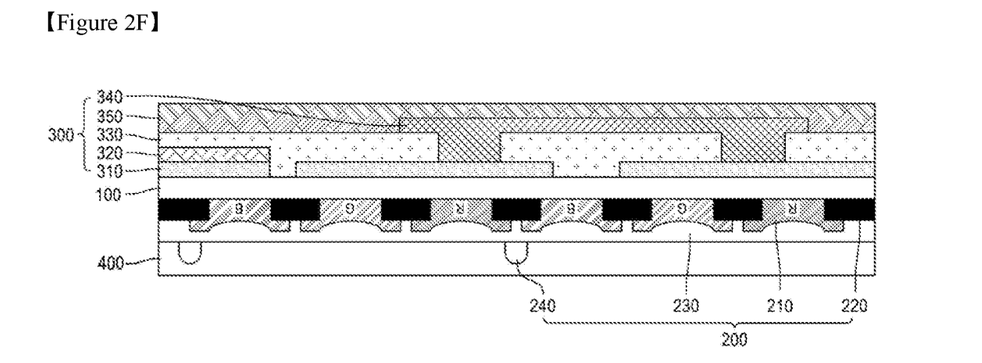

Next, as shown in FIG. 2F, an insulation layer 330, a second transparent electrode layer 340, and a passivation layer 350 are sequentially formed on the metal electrode layer 320 to complete the touch sensor 300.

Figure 2G:
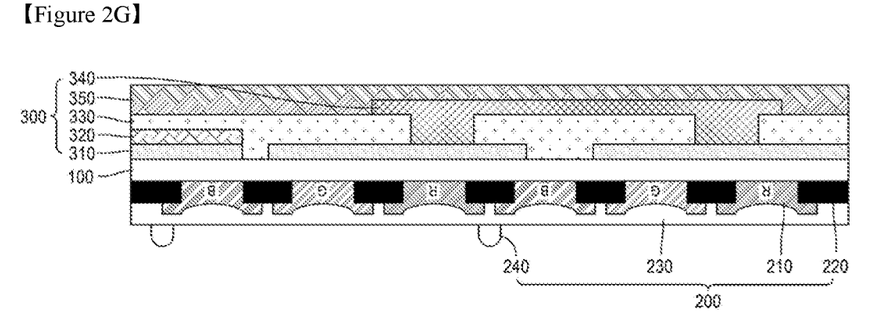

Upon completion of the touch sensor 300, the protective film 400 attached to protect the color filter 200 is peeled off (FIG. 2G).

At this time, while the peeling strength of the color filter 200 and the touch sensor 300 from the substrate is 2N/25 mm or more, the peeling strength of the protective film 400 is 1.5N/25 mm or less. Accordingly, the protective film 400 may be peeled off without damaging the color filter 200 and the touch sensor 300.

As described above, when the color filter 200 and the touch sensor 300 are arranged on each side of the substrate 100 using a single substrate, a precise alignment is feasible with the tolerance regarding lamination of ±2.0 µm to ±5.0 µm. On the other hand, if the color filter and the touch sensor are manufactured separately and then assembled, the tolerance due to the individual cell cutting of the color filter and the touch sensor is around ±100.0 µm, and the tolerance due to the assembly of the individual cells is also around ±100.0 µm. Taking this into consideration, the overall tolerance becomes ±200.0 µm, and it can be seen that the present invention brings about 40 to 100 times higher precision.

Figure 3A:
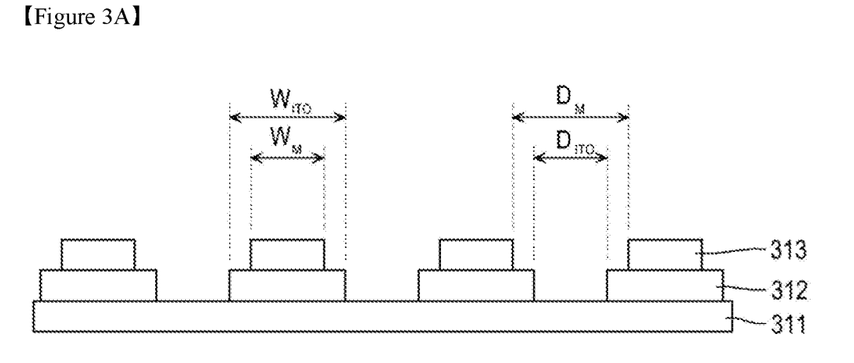
FIGS. 3A and 3B are cross-sectional views illustrating a fine pattern implementation of a color filter-integrated touch sensor according to an embodiment of the present invention.
Figure 3B:
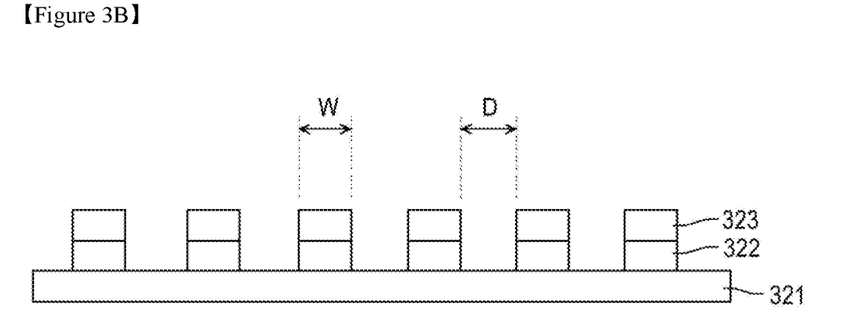

FIGS. 3A and 3B are cross-sectional views illustrating a fine pattern implementation of a color filter-integrated touch sensor according to an embodiment of the present invention. FIG. 3A shows a case in which a metal electrode layer is first patterned and then a first transparent electrode layer is patterned, as in the conventional touch sensor manufacturing process, and FIG. 3B shows a case in which a first transparent electrode layer is first patterned and then a metal electrode layer is patterned according to an embodiment of the present invention.

When a transparent conductive film and a metal film are sequentially deposited on a substrate 311, the metal film is first patterned, and then the transparent conductive film is patterned to form a first transparent electrode layer 312 and a metal electrode layer 313, the etching solution of the metal film does not affect the transparent conductive film while the etching solution of the transparent conductive film can simultaneously etch the metal film. Accordingly, as shown in FIG. 3A, a wiring width $W_{ITO}$ of the first transparent electrode layer 312 is formed to be wider than a wiring width $W_M$ of the metal electrode layer 313.

Specifically, the wiring width $W_{ITO}$ of the first transparent electrode layer 312 becomes about 3 to 5 µm wider than the wiring width $W_M$ of the metal electrode layer 313.

This also widens wiring distances $D_{ITO}$ and $D_M$ of the first transparent electrode layer 312 and the metal electrode layer 313. That is, in the process of patterning the transparent conductive film, an area larger than the wiring width $W_M$ of the metal electrode layer 313 must be covered. In this process, when the distance between the wires of the first transparent electrode layers 312 gets closer or the wires stick, it may cause defects in touch driving. Therefore, in order to prevent such defects, there is a limitation in reducing the wiring distances $D_{ITO}$ and $D_M$ of the first transparent electrode layer 312 and the metal electrode layer 313.

Accordingly, there is a limitation in improving the resolution of the first transparent electrode layer 312 and the metal electrode layer 313.

On the other hand, as in an embodiment of the present invention, when a first transparent electrode layer 322 is first patterned on a substrate 321 and then a metal electrode layer 323 is patterned, the etching solution of the transparent conductive film does not affect the metal film. Therefore, a wiring width W of the first transparent electrode layer 322 and the metal electrode layer 323 may be formed identically, and may be formed to have a narrower wiring width W and a narrower wiring distance D.

Specifically, in the case of the color filter-integrated touch sensor according to an embodiment of the present invention, wires of the first transparent electrode layer 322 and the metal electrode layer 323 may be formed to have a wiring width of 4 to 10 μm and a wiring distance of 4 to 10 μm. For higher resolution, the wires of the first transparent electrode layer 322 and the metal electrode layer 323 may be formed to have a wiring width of 4 to 6 μm and a wiring distance of 4 to 6 μm.

When the resolution of the wiring is increased as such, the area occupied by the wiring of the touch sensor pad unit is reduced, and thus a display device having a narrow bezel area can be realized.

The color filter-integrated touch sensor according to an embodiment of the present invention may be combined with a display layer to be used for a display device.

Figure 4:
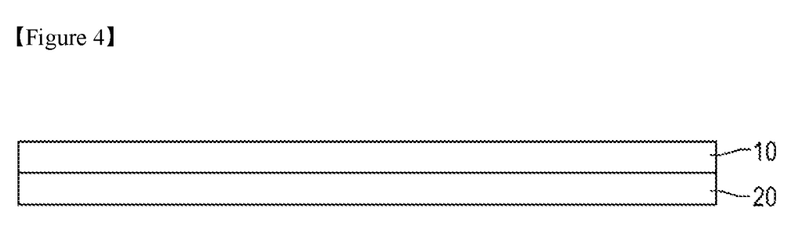
FIG. 4 is a cross-sectional view of a display device including a color filter-integrated touch sensor according to an embodiment of the present invention.

FIG. 4 is a cross-sectional view of a display device according to an embodiment of the present invention.

Referring to FIG. 4, the display device according to an embodiment of the present invention includes a color filter-integrated touch sensor 10 according to an embodiment of the present invention and a display layer 20 under the color filter-integrated touch sensor 10.

The display layer 20 may be anything that can be applied to a flexible display device, without limitation. For example, an OLED layer or an LCD layer may be used. In particular, when the display layer 20 is an OLED layer, the color filter-integrated touch sensor 10 according to an embodiment of the present invention may have a function of replacing an anti-reflective polarizing plate.

The preferred embodiments of the present invention have been described above with reference to the drawings. However, the present invention is not limited to the above-described embodiments, it will be understood that the present invention can be implemented in a modified form without departing from the essential characteristics of the present invention. The above-described embodiments of the present invention can be applied independently or in combination with some or all of its features.

Therefore, the scope of the present invention is defined by the claims rather than the foregoing description, and all differences within the equivalent range should be interpreted as being included in the present invention.

DESCRIPTION OF REFERENCE NUMERALS

10: color filter-integrated touch sensor
20: display layer
100, 311, 321: substrate
200: color filter
210: pixel region
220: black matrix
230: overcoat layer
240: photo spacer
300: touch sensor
310, 312, 322: first transparent electrode layer
320, 313, 323: metal electrode layer
330: insulation layer
340: second transparent electrode layer
350: passivation layer
400: protective film

The invention claimed is:

1. A color filter-integrated touch sensor comprising:
    a substrate having a first surface and a second surface;
    a color filter disposed on the first surface side of the substrate; and
    a touch sensor disposed on the second surface side of the substrate, wherein
    a peeling strength of the color filter and the touch sensor from the substrate is 2N/25 mm to 15N/25 mm, and
    a width of at least some of wires constituting the touch sensor is 4 to 6 μm.

2. The color filter-integrated touch sensor according to claim 1, wherein a distance between at least some of the wires constituting the touch sensor is 4 to 6 μm.

3. A thin film display including the color filter-integrated touch sensor according to claim 2.

4. The color filter-integrated touch sensor according to claim 1, wherein the touch sensor includes:
    a first transparent electrode layer on the second surface of the substrate;
    a metal electrode layer on the first transparent electrode layer;
    an insulation layer on the metal electrode layer;
    a second transparent electrode layer on the insulation layer; and
    a passivation layer on the second transparent electrode layer, and wherein a width of the first transparent electrode layer and a width of the metal electrode layer are identical in at least some of the wires constituting the touch sensor.

5. A thin film display including the color filter-integrated touch sensor according to claim 4.

6. The color filter-integrated touch sensor according to claim 1, wherein the substrate is a glass substrate with a thickness of 0.1 mm to 1.0 mm.

7. A thin film display including the color filter-integrated touch sensor according to claim 6.

8. A thin film display including the color filter-integrated touch sensor according to claim 1.

9. The thin film display according to claim 8, wherein the thin film display is a liquid crystal display or an organic light emitting diode display.

10. A method of manufacturing a color filter-integrated touch sensor comprising steps of:
    forming a color filter including a black matrix and a pixel region on a first surface of a substrate;
    adhering a protective film on the color filter;
    flipping the substrate;
    forming a touch sensor on a second surface of the substrate; and
    removing the protective film.

11. The method of manufacturing a color filter-integrated touch sensor according to claim 10, wherein a peeling strength of the color filter and the touch sensor from the substrate is 2N/25 mm to 15N/25 mm.

12. The method of manufacturing a color filter-integrated touch sensor according to claim 10, wherein a peeling strength of the protective film is 0.01N/25 mm to 1.5N/25 mm.

13. The method of manufacturing a color filter-integrated touch sensor according to claim 10, wherein the step of forming a touch sensor includes steps of:
- forming a first transparent electrode layer on the second surface;
- forming a metal electrode layer on the first transparent electrode layer;
- forming an insulation layer on the metal electrode layer;
- forming a second transparent electrode layer on the insulation layer; and
- forming a passivation layer on the second transparent electrode layer.

14. The method of manufacturing a color filter-integrated touch sensor according to claim 13, wherein the step of forming a first transparent electrode layer is a step of forming the first transparent electrode layer using an alignment key formed together with the black matrix in the step of forming a color filter.

15. The method of manufacturing a color filter-integrated touch sensor according to claim 14, wherein the metal electrode layer has a same width as that of the first transparent electrode layer in at least some of wires constituting the touch sensor.

16. The method of manufacturing a color filter-integrated touch sensor according to claim 13, wherein a width of at least some wires of the first transparent electrode layer is 4 to 6 µm.

17. The method of manufacturing a color filter-integrated touch sensor according to claim 13, wherein a distance between at least some wires of the first transparent electrode layer is 4 to 6 µm.

18. The method of manufacturing a color filter-integrated touch sensor according to claim 10, further comprising a step of etching the substrates after the step of adhering a protective film.

* * * * *